(12) United States Patent
Chiu et al.

(10) Patent No.: US 7,803,687 B2
(45) Date of Patent: Sep. 28, 2010

(54) METHOD FOR FORMING A THIN FILM RESISTOR

(75) Inventors: Kai-Ling Chiu, Pingtung County (TW);
Chih-Yu Tseng, Hsinchu (TW);
Victor-Chiang Liang, Hsin-Chu (TW);
You-Ren Liu, Kaohsiung (TW);
Chih-Chen Hsueh, Kaohsiung (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 207 days.

(21) Appl. No.: 12/253,244

(22) Filed: Oct. 17, 2008

(65) Prior Publication Data
US 2010/0099229 A1     Apr. 22, 2010

(51) Int. Cl.
*H01L 21/20* (2006.01)
(52) U.S. Cl. .................. 438/384; 257/350; 257/536; 257/537; 257/538; 257/E27.025; 257/E27.33; 257/E27.035; 438/238; 438/382; 438/385
(58) Field of Classification Search .............. 438/384; 257/538, 350, E27.025, E27.033, E27.035
See application file for complete search history.

(56) References Cited

U.S. PATENT DOCUMENTS

| 5,030,588 | A | 7/1991 | Hosaka |
| 5,128,745 | A | 7/1992 | Takasu et al. |
| 6,261,916 | B1 * | 7/2001 | Re et al. ..................... 438/385 |
| 6,872,655 | B2 | 3/2005 | Mahalingam et al. |
| 7,212,396 | B2 * | 5/2007 | Wu .............................. 361/309 |
| 2010/0019328 | A1 * | 1/2010 | Zhang et al. ................ 257/380 |

* cited by examiner

*Primary Examiner*—Matthew C Landau
*Assistant Examiner*—Vicki B Booker
(74) *Attorney, Agent, or Firm*—Winston Hsu; Scott Margo; Min-Lee Teng

(57) ABSTRACT

A method for forming a thin film resistor includes providing a substrate having a transistor region and a thin film resistor region defined thereon, sequentially forming a dielectric layer, a metal layer and a first hard mask layer on the substrate, patterning the first hard mask layer to form at least a thin film resistor pattern in the thin film resistor region, sequentially forming a polysilicon layer and a second hard mask layer on the substrate, patterning the second hard mask layer to form at least a gate pattern in the transistor region, and performing an etching process to form a gate and a thin film resistor respectively in the transistor region and the thin film resistor region.

20 Claims, 4 Drawing Sheets

METHOD FOR FORMING A THIN FILM RESISTOR

BACKGROUND OF THE INVENTION

1. Field of the Invention

The invention relates to a method for forming a thin film resistor, and more particularly, to a method for forming a thin film resistor integrated with a metal gate process.

2. Description of the Prior Art

In the field of semiconductor fabrication, polysilicon material has been conventionally used to form the gate of metal-Oxide-Semiconductor Field-Effect (MOSFET) transistors. However, the polysilicon material possesses some drawbacks: the resistance of the polysilicon gate is higher than most of metal materials, thus the conductivity rate of the polysilicon gate is lower than metal wire. To compensate for this disadvantage, the polysilicon gate usually undergoes a silicide process for simultaneously reducing contact resistance and parasitic resistance ($R_p$), thus the conductivity rate of the polysilicon gate is improved to an acceptable range.

Secondly, the polysilicon gate also faces the boron penetration effect and an unavoidable depletion effect that deteriorate the performance of the device. Therefore the work function metal material approach which needs no ion implantation and thus avoids the boron penetration effect and the depletion effect ion effect is used to replace the polysilicon in gate formation.

It is noteworthy that the polysilicon is used not only to form the gate, but also to form passive devices of the mixed-mode integrated circuit devices, such as the capacitor, or the thin film resistor, etc. It is also well-known that the resistance of the thin film resistor made of polysilicon can be adjusted by modifying factors such as temperature or pressure in the polysilicon deposition process, or by adjusting the area, the thickness, or the concentration of implanted dopants to the polysilicon layer.

Nevertheless, in the trend to replace the polysilicon gate with the metal gate, those integratedly-formed passive devices which used to be made of polysilicon are also replaced with metal materials. Similar with the formation process of the active devices, passive devices such as thin film resistor is fabricated by integrating formations of the metal layer and the dielectric layer, the photolithography process, and the etching process. It is conceivable that the integration of metal thin film resistor process and the metal gate process, particularly the gate-first process, is more complicated while the thickness and composition controls for the materials in use are more difficult.

Therefore how to succeed in the integrating the metal gate and the thin film resistor without increasing process complexity and cost in such strict requirements has become an important study in the field.

SUMMARY OF THE INVENTION

It is therefore a primary objective of the claimed invention to provide a competitive method for forming a thin film resistor without increasing process cost.

According to the claim invention, a method for forming a thin film resistor is provided. The method comprises providing a substrate having a transistor region and a thin film resistor region defined thereon, sequentially forming a dielectric layer, a metal layer and a first hard mask layer on the substrate, patterning the first hard mask layer to form at least a thin film resistor pattern in the thin film resistor region, sequentially forming a polysilicon layer and a second hard mask layer on the metal layer, the first hard mask layer being sandwiched by the metal layer and the polysilicon layer, patterning the second hard mask layer to form at least a gate pattern in the transistor region, and performing an etching process to remove a portion of the polysilicon layer, the metal layer and the dielectric layer to form a gate and a thin film resistor respectively in the transistor region and the thin film resistor region.

According to the method for forming the thin film resistor provided by the present invention, the metal layer is protected by the first hard mask layer that is sandwiched by the polysilicon layer and the metal layer during the etching process, thus the metal gate and the thin film resistor are simultaneously formed in one etching process. Furthermore, since the first hard mask layer is patterned by the SAB mask which is conventionally used in kinds of transistor processes, the cost will not be increased for constructing additional photo mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
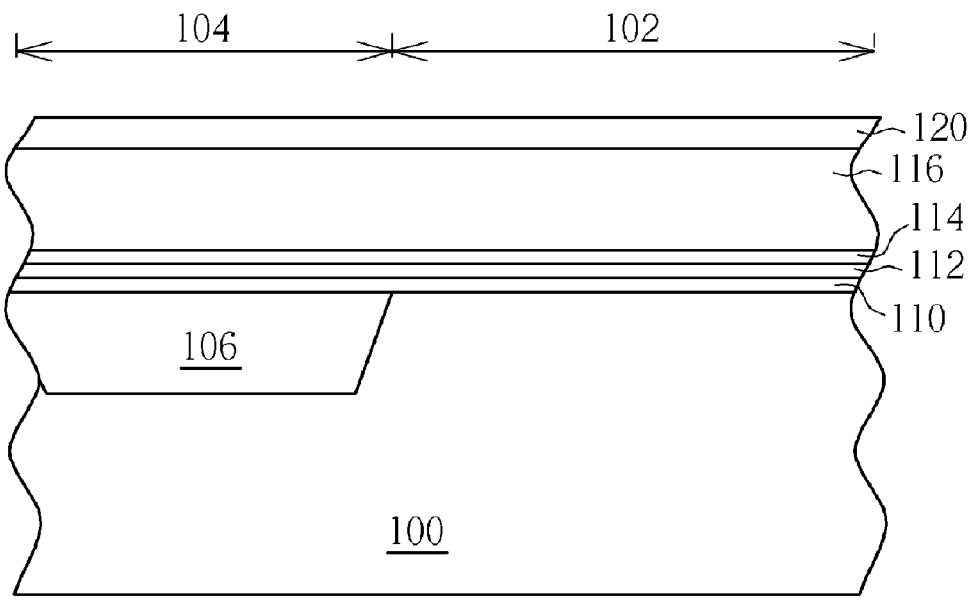
FIGS. 1-7 are schematic drawings illustrating a method for forming a thin film resistor according to a first preferred embodiment of the present invention.

Please refer to FIGS. 1-7, which are schematic drawings illustrating a method for forming a thin film resistor according to a first preferred embodiment of the present invention. As shown in FIG. 1, substrate 100 such as a silicon substrate, a silicon-containing substrate, or a silicon-on-insulator (SOI) substrate having a transistor region 102 and a thin film resistor region 104 defined thereon is provided. The substrate 100 further comprises a shallow trench isolation (STI) 106 positioned in the thin film resistor region 104. Next, an insulating layer 110 comprising oxide, a dielectric layer 112 and a metal layer 116 are sequentially formed on the substrate 100. The dielectric layer 112 is a high-K dielectric layer comprising SiO, SiN, oxy-nitride, HfSiON, $HfO_2$, $Al_2O_3$, $TaO_3$, other metal oxides, or combination of the above-mentioned materials. The metal layer 116 comprises refractory metal, W, Al, AlCu, Ti, $TiSi_2$, Co, $CoSi_2$, NiSi, TiN, TiW, or TaN. Furthermore, to prevent the dielectric layer 112 from diffusion and reacting with the metal layer 116, a barrier layer 114 is selectively formed on the dielectric layer 112 before forming the metal layer 116 as shown in FIG. 1. The barrier layer 114 comprises refractory metal, noble metal, lanthanide series elements, and their carbide, nitride, silicide, or nitride silicide. The barrier layer 114 also can be a cap layer serving for adjusting work function of the metal layer 116, the cap layer includes $La_2O_3$, $Dy_2O_3$, MgO, or $Al_2O_3$.

Please still refer to FIG. 1. Then, a first hard mask layer 120 is deposited on the substrate 100. Due to the relatively lower melting point of the metal layer 116, the temperature for depositing the first hard mask layer 120 has to be lower to avoid influence upon the metal layer 116. Therefore the first hard mask layer 120 preferably comprises oxide, nitride, $HfO_2$, $Al_2O_3$, $TaO_3$, or materials used in the insulating layer 110, the dielectric layer 112, or the barrier layer 114. And a thickness of the first hard mask layer 120 is less than 1000 angstroms, preferably between 100 angstroms and 200 angstroms.

Figure 2:
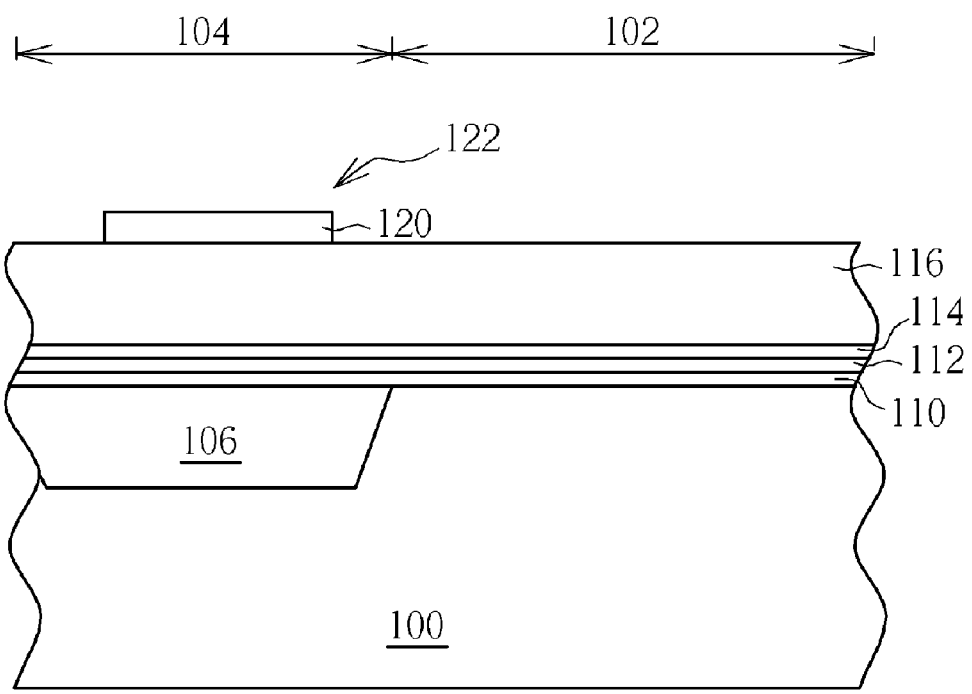

Please refer to FIG. 2. A step of patterning the first hard mask layer 120 is performed to form at least a thin film resistor pattern 122 on the STI 106 in the thin film resistor region 104. It is noteworthy that the step of patterning the first hard mask layer 120 is performed with a salicide-blocked (SAB) mask. Since the SAB mask is conventionally used in the semiconductor processes, no additional photo mask is required according to the present invention, and thus no additional cost is caused.

Figure 3:
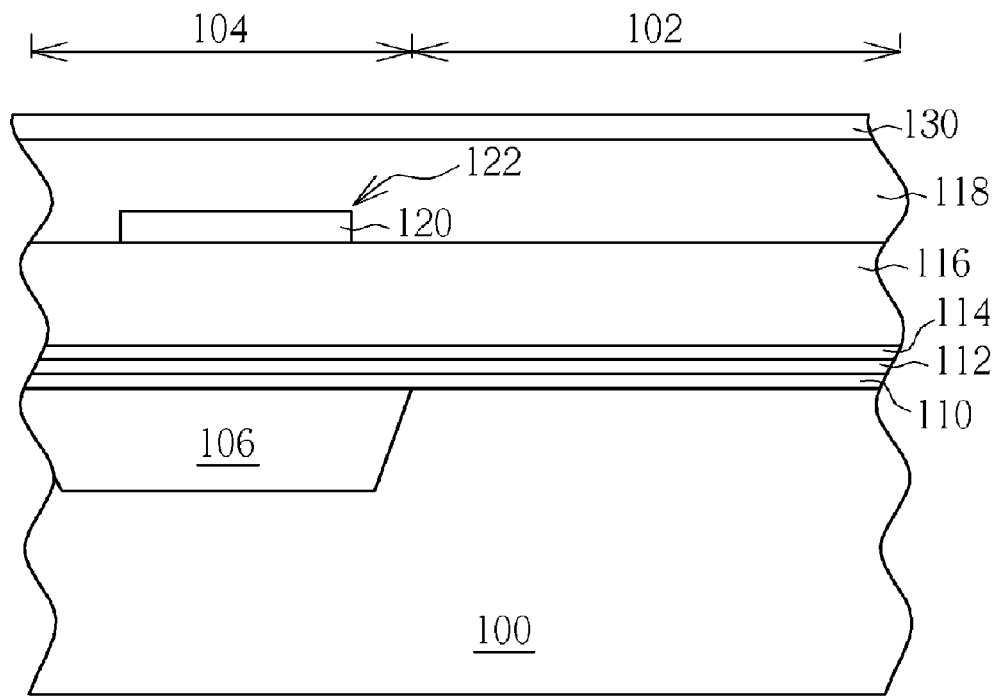
Figure 4:
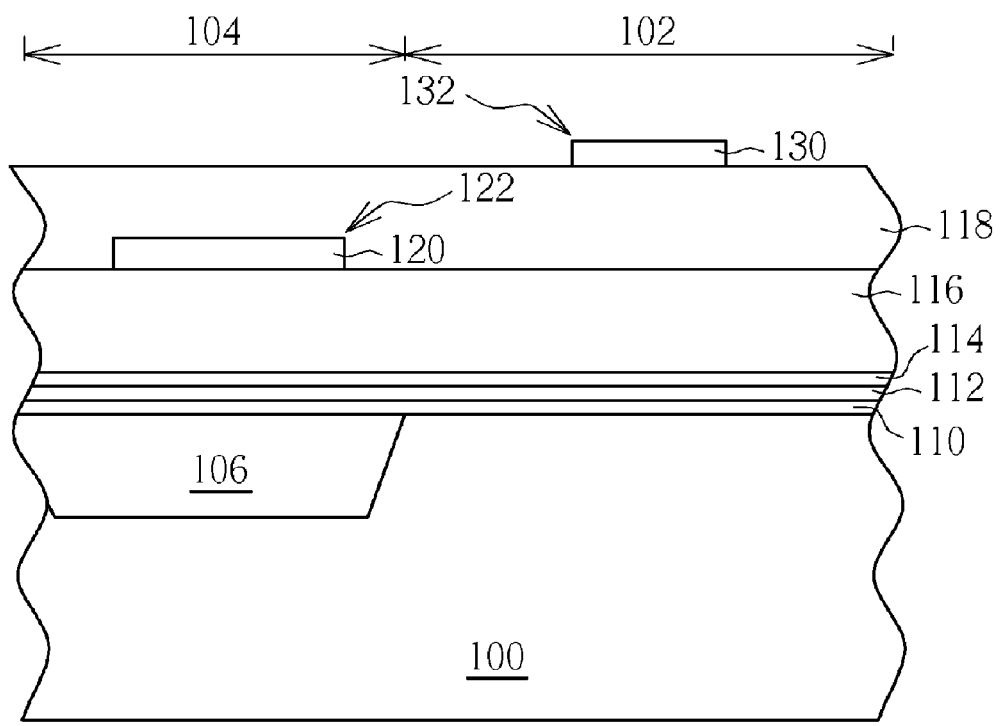

Please refer to FIGS. 3-4. A polysilicon layer 118 and a second hard mask layer 130 are sequentially formed on the substrate 100. Furthermore, a doping step is selectively performed to the polysilicon layer 118 for adjusting a resistance of the gate to the desired resistance before forming the second hard mask layer 130. The second hard mask layer 130 comprises materials having considerably different etching selectivity from the polysilicon layer 118, such as oxide or nitride. The materials used to form the second hard mask layer 130 and the first hard mask layer 120 are not limited to being similar or different. As shown FIG. 4, a step of patterning the second hard mask layer 130 is performed to form at least a gate pattern 132 in the transistor region 102. Additionally, the gate pattern 132 can be obtained by forming, exposing, and developing a photoresist (not shown), thus following etching process is performed without forming the second hard mask layer 130.

Figure 5:
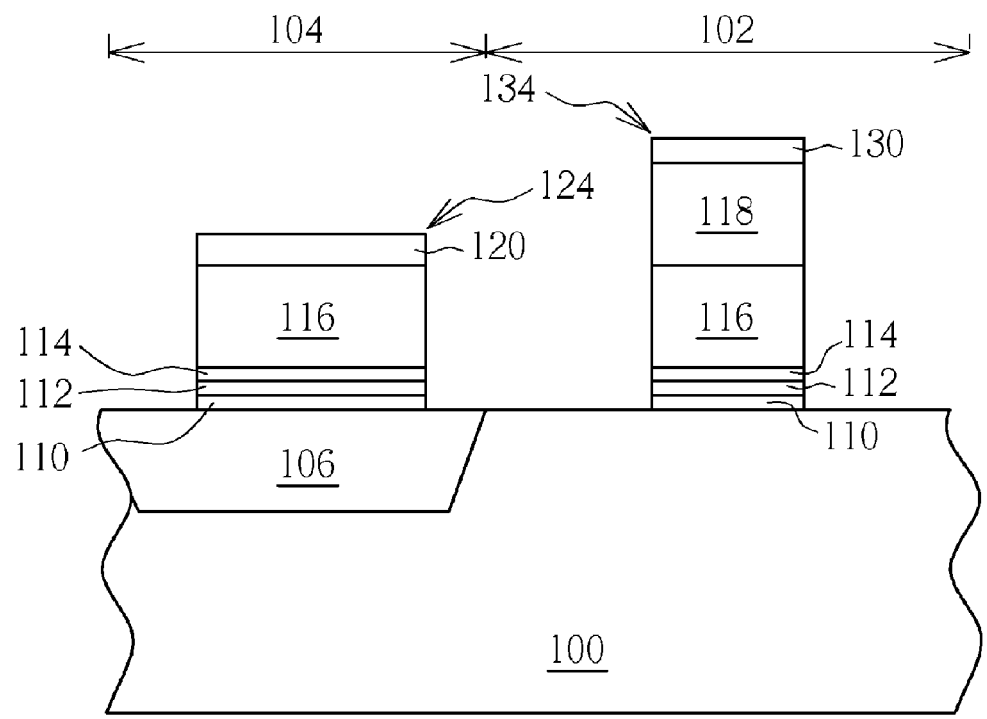
Figure 6:
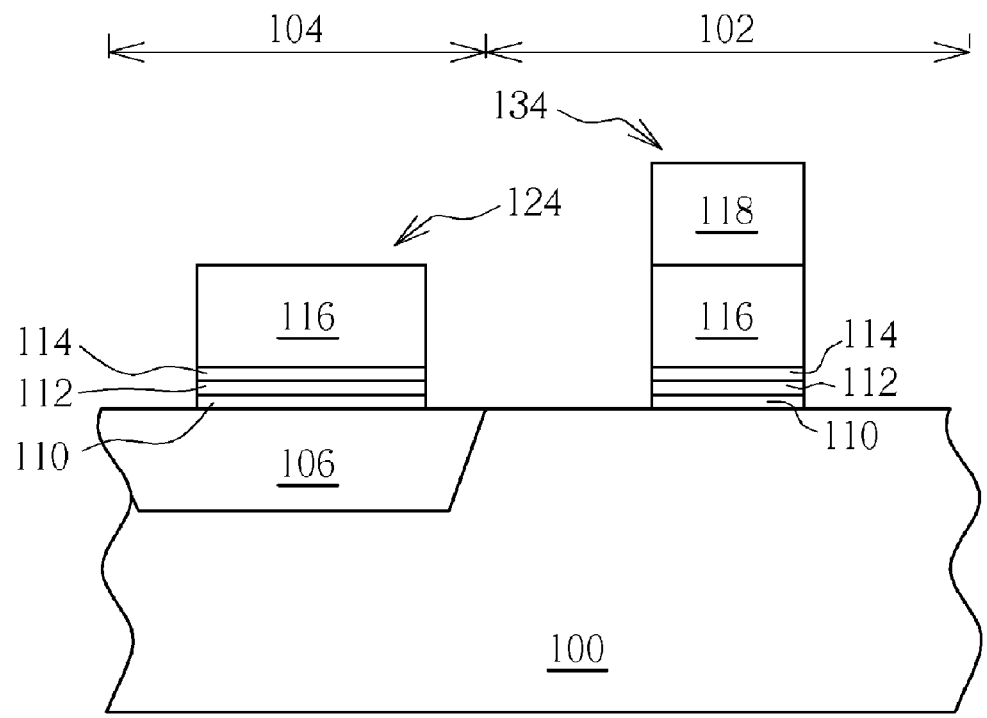

Please refer to FIGS. 5-6. An etching process is performed to remove a portion of the polysilicon layer 118, the metal layer 116, the barrier layer 114, the dielectric layer 112, and the insulating layer 110 to form a gate 134 and a thin film resistor 124 respectively in the transistor region 102 and the thin film resistor region 104 while the thin film resistor 124 is formed on the STI 106. In the etching process, the second hard mask layer 130 serves as a mask to remove the portion of the polysilicon layer 118 while the first hard mask layer 120 serves as a stop layer. Then, the second hard mask layer 130 and the first hard mask layer 120 serve as masks to remove the portion of the metal layer 116, the barrier layer 114, and the dielectric layer 112 till surfaces of the substrate 100 and the STI 106 are exposed. As shown in FIG. 6, a step of removing the first hard mask layer 120 and the second hard mask layer 130 is performed after the etching process to accomplish integrated formation of the metal gate 134 and the thin film resistor 124. In addition, after removing the first hard mask layer 130 and the second hard mask layer 120, the exposed metal layer 116 is thinned by another etching process for further increasing the resistance of the thin film resistor 124.

In a modification of the first preferred embodiment, a thickness or material of the first hard mask layer 120 can be adjusted so that the first hard mask layer 120 is also removed by the etching process, thus the etching process will continually remove the metal layer 116 which is originally protected by the first hard mask layer 120. Therefore the metal layer 116 in the thin film resistor region 104 is thinned in the etching process to further increase the resistance of the thin film resistor 124. In this modification, only the second hard mask layer 130 is removed after the etching process.

Figure 7:
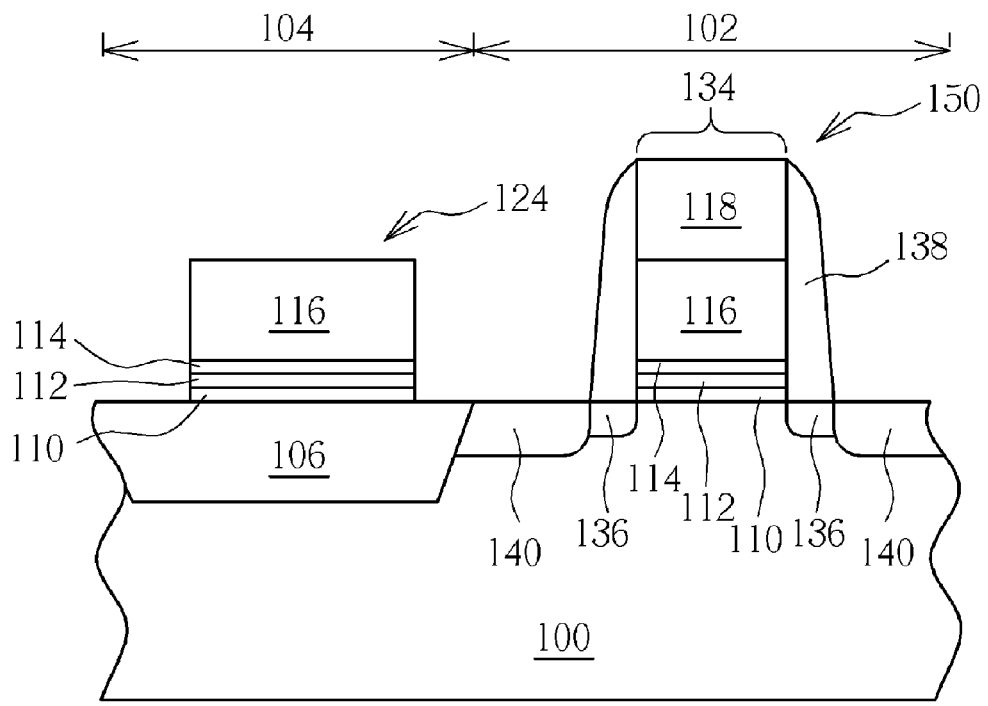

Please refer to FIG. 7. After forming the gate 134 and the thin film resistor 124, a first ion implantation is performed to form lightly doped drains (LDDs) 136 in the substrate 100 at two sides of the gate 134. Then, a spacer 138 is formed on sidewalls of the gate 134, followed by performing a second ion implantation to form a source/drain 140 in the substrate 100 at two sides of the gate 134. Those steps or processes are well-known to those skilled in the art; therefore the details are omitted herein in the interest of brevity.

Figure 8:
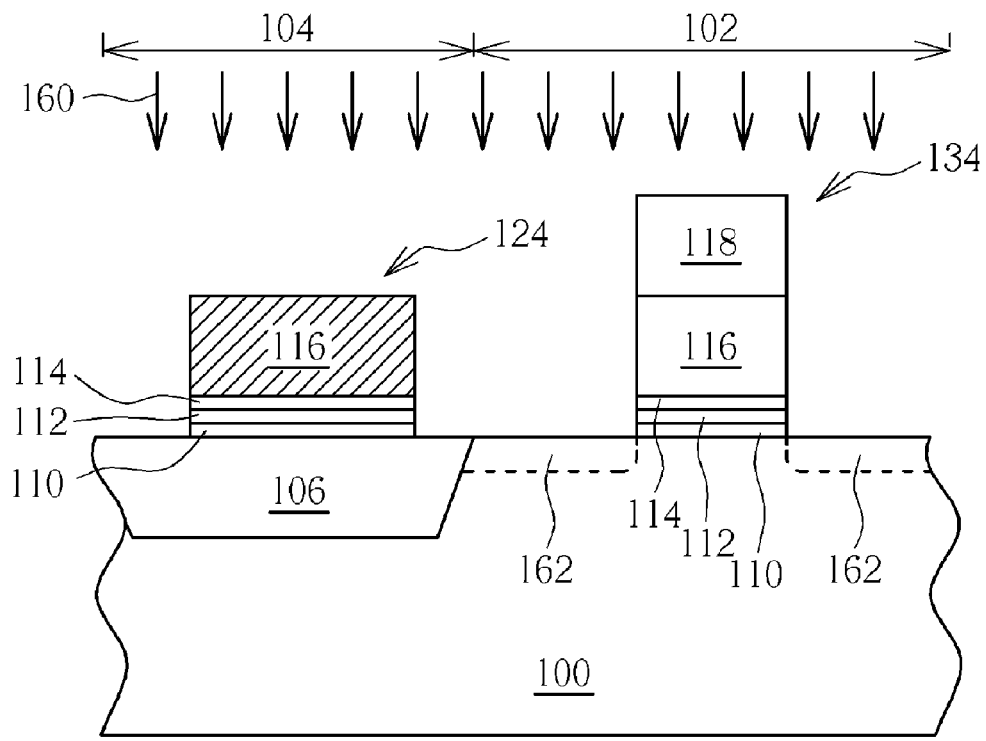
FIG. 8 is a schematic drawing illustrating a method for forming a thin film resistor according to a second preferred embodiment of the present invention.

Please refer to FIG. 8, which is a schematic drawing illustrating a method for forming a thin film resistor according to a second preferred embodiment of the present invention. Because most steps for integratedly forming the thin film resistor and the metal gate in the second preferred embodiment are similar with the first preferred embodiment, those steps are omitted in the interest of brevity. As shown in FIG. 8, a pre-implant process 160 is performed after removing the first hard mask layer 120 and the second hard mask layer 130, which is performed after the portion of the polysilicon layer 118, the metal layer 116, the barrier layer 114, the dielectric layer 112, and the insulating layer 110 are removed in the etching process. The pre-implant process is performed to amorphize the substrate 100 at the two sides of the gate 134 and to dope the metal layer 116.

The pre-implant process 160 is performed with antimony (Sb) or germanium (Ge) in proper energy and dosage to damage a silicon lattice of the substrate 100, thus to form amorphized regions 162 in the substrate 100 at the two sides of the gate 134. The damaged silicon lattice in the amorphized regions 162 is used to reduce a transient enhanced diffusion (TED) effect and a boron channeling effect. In addition, the PAI process 160 further treats the metal layer 116 in the thin film resistor region 104 for increasing the resistance of the thin film resistor 124 and exerting an influence upon its performance.

Following the PAI process 160, the first ion implantation is performed to form the LDDs 136 at the two sides of the gate 134, and the spacer 138 is formed on the sidewalls of the gate 134. Then, the second ion implantation is performed to form the source/drain 140 in the substrate 100 at the two sides of the gate 134 to accomplish the formation of the transistor 150 having metal gate. Since those steps are similar with those described in the first preferred embodiment, the details are also omitted herein in the interest of brevity.

According to the method for forming a thin film resistor provided by the present invention, the metal layer is protected by the first hard mask layer which is sandwiched by the polysilicon layer and the metal layer during the etching process, thus the metal gate and the thin film resistor are simultaneously formed in one etching process. In the complicated and strict environmental requirement of the integration of gate-first metal gate and other relative devices, the method provided by the present invention completely avoids separately forming the metal gate and the thin film resistor by two different etching processes and thus avoids the caused burden to the process control. In addition, since the SAB mask used to pattern the first hard mask layer is conventionally used in the semiconductor processes, no additional photo mask is required and thus no additional cost is caused, either. Furthermore, the PAI process is introduced to simultaneously reduce the TED effect of the transistor and increase the resistance of the thin film resistor according to the present invention. Accordingly, the method for forming a thin film resistor provided by the present invention is a successful integration of one-off forming the metal gate and the thin film resistor without increasing the process complexity and the cost.

Those skilled in the art will readily observe that numerous modifications and alterations of the device and method may be made while retaining the teachings of the invention.

What is claimed is:

1. A method for forming a thin film resistor comprising:
   providing a substrate having a transistor region and a thin film resistor region defined thereon;

sequentially forming a dielectric layer, a metal layer and a first hard mask layer on the substrate;
patterning the first hard mask layer to form at least a thin film resistor pattern in the thin film resistor region;
sequentially forming a polysilicon layer and a second hard mask layer on the metal layer, the first hard mask layer being sandwiched by the metal layer and the polysilicon layer;
patterning the second hard mask layer to form at least a gate pattern in the transistor region; and
performing an etching process to remove a portion of the polysilicon layer, the metal layer and the dielectric layer to form a gate and a thin film resistor respectively in the transistor region and the thin film resistor region.

2. The method of claim 1, wherein the dielectric layer is a high-K dielectric layer.

3. The method of claim 2, wherein the high-K dielectric layer comprises SiO, SiN, oxy-nitride, HfSiON, $HfO_2$, $Al_2O_3$, $TaO_3$, combination of above-mentioned materials.

4. The method of claim 1 further comprising a barrier layer sandwiched by the metal layer and the dielectric layer, the barrier layer comprising refractory metal, noble metal, lanthanide series elements, and their carbide, nitride, silicide, or nitride silicide.

5. The method of claim 4, wherein the barrier layer is a cap layer serving for adjusting a work function of the metal layer and comprises $La_2O_3$, $Dy_2O_3$, MgO, or $Al_2O_3$.

6. The method of claim 1, wherein the metal layer comprises refractory metal, W, Al, AlCu, Ti, $TiSi_2$, Co, $CoSi_2$, NiSi, TiN, TiW, or TaN.

7. The method of claim 1, wherein the first hard mask layer comprises oxide or nitride.

8. The method of claim 1, wherein a thickness of the first hard mask layer is less than 1000 angstroms.

9. The method of claim 8, wherein the thickness of the first hard mask layer is preferably between 100 angstroms and 200 angstroms.

10. The method of claim 1, wherein the step of patterning the first hard mask layer is performed with a salicide-blocked (SAB) mask.

11. The method of claim 1, wherein the thin film resistor is formed on a shallow trench isolation (STI).

12. The method of claim 1, wherein the first hard mask layer serves as a stop layer while removing the portion of the polysilicon layer in the etching process.

13. The method of claim 12, wherein the first hard mask layer and the second hard mask layer serve as mask for removing the portion of the metal layer and the dielectric layer to respectively form the gate and the thin film resistor in the transistor region and the thin film resistor region in the etching process.

14. The method of claim 1 further comprising a step of removing the first hard mask layer and the second hard mask layer performed after the etching process.

15. The method of claim 14 further comprising performing a pre-implant process to amorphize the substrate at two sides of the gate and to dope the metal layer after removing the first hard mask layer and the second hard mask layer.

16. The method of claim 1, wherein the gate etching process further removes the first hard mask layer.

17. The method of claim 16, wherein the etching process further thins the metal layer in the thin film resistor region.

18. The method of claim 16 further comprising performing a step of removing the second hard mask layer after the etching process.

19. The method of claim 18 further comprising performing a pre-implant process to amorphize the substrate at two sides of the gate and to dope the thinned metal layer after removing the second hard mask layer.

20. The method of claim 1 further comprising steps of:
performing a first ion implantation to form lightly doped drains (LDDs) in the substrate respectively at two sides of the gate;
forming a spacer at sidewalls of the gate; and
performing a second ion implantation to form a source/drain in the substrate at two sides of the gate.

* * * * *